United States Patent
Shimizu et al.

(10) Patent No.: US 9,173,107 B2
(45) Date of Patent: Oct. 27, 2015

(54) ANALOG FRONT-END CIRCUIT FOR MEASUREMENT

(71) Applicant: YOKOGAWA ELECTRIC CORPORATION, Musashino-shi, Tokyo (JP)

(72) Inventors: Kazuhiro Shimizu, Musashino (JP); Tomonori Komachi, Musashino (JP); Kazuhide Yasuda, Musashino (JP); Sadao Mori, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 323 days.

(21) Appl. No.: 13/743,830

(22) Filed: Jan. 17, 2013

(65) Prior Publication Data

US 2013/0182595 A1    Jul. 18, 2013

(30) Foreign Application Priority Data

Jan. 18, 2012 (JP) ................. 2012-008061

(51) Int. Cl.
| | |
|---|---|
| *H04W 24/00* | (2009.01) |
| *H03M 3/00* | (2006.01) |
| *H04N 1/00* | (2006.01) |
| *G01D 3/02* | (2006.01) |
| *H03M 1/08* | (2006.01) |

(52) U.S. Cl.
CPC .............. *H04W 24/00* (2013.01); *H03M 3/368* (2013.01); *G01D 3/022* (2013.01); *H03M 1/0827* (2013.01); *H04N 1/0083* (2013.01)

(58) Field of Classification Search
None
See application file for complete search history.

(56) References Cited

U.S. PATENT DOCUMENTS

| | | | |
|---|---|---|---|
| 5,363,081 A | 11/1994 | Bando et al. | |
| 6,416,471 B1* | 7/2002 | Kumar et al. | 600/300 |
| 8,648,618 B1* | 2/2014 | Shih et al. | 324/764.01 |
| 2006/0176201 A1* | 8/2006 | Kimura et al. | 341/144 |

(Continued)

FOREIGN PATENT DOCUMENTS

| | | |
|---|---|---|
| JP | 653052 A | 2/1994 |
| JP | 7146738 A | 6/1995 |

(Continued)

OTHER PUBLICATIONS

Office Action dated Dec. 23, 2013, corresponds to Korean patent application No. 10-2013-0005660.

(Continued)

*Primary Examiner* — Vincelas Louis
(74) *Attorney, Agent, or Firm* — Hauptman Ham, LLP

(57) ABSTRACT

An analog front-end circuit for measurement used as an interface between a sensor and a control device includes: an isolated part including at least an AD conversion circuit configured to serve as an interface to the sensor; a non-isolated part including at least a control circuit configured to serve as an interface to the control device; and an isolated communication unit configured to perform isolated half-duplex communication between the isolated part and the non-isolated part. The control circuit is configured to transmit an AD conversion instruction to the AD conversion circuit after providing setting for measurement to the isolated part via the isolated communication unit, obtain a result of AD conversion by the AD conversion circuit from the isolated part via the isolated communication unit, and transfer the obtained AD conversion result to the control device.

12 Claims, 3 Drawing Sheets

(56) References Cited

U.S. PATENT DOCUMENTS

| | | | |
|---|---|---|---|
| 2007/0086217 A1* | 4/2007 | Zhang et al. | 363/17 |
| 2008/0279225 A1 | 11/2008 | Den Besten et al. | |
| 2010/0240327 A1* | 9/2010 | Lambrecht et al. | 455/95 |
| 2011/0109320 A1* | 5/2011 | Curt et al. | 324/543 |

FOREIGN PATENT DOCUMENTS

| | | |
|---|---|---|
| JP | 2001155282 A | 6/2001 |
| JP | 2002373392 A | 12/2002 |
| JP | 200357270 A | 2/2003 |
| JP | 200835039 A | 2/2008 |
| JP | 2009516978 A | 4/2009 |
| JP | 20114260 A | 1/2011 |
| WO | 2007060620 A1 | 5/2007 |

OTHER PUBLICATIONS

"Low-Power, Low-Noise Multichannel Sensor Signal Processor", MAX1464 Data Sheet Rev 0, http://www.maximintegrated.com/datasheet/index.mvp/id/4590, Maxim integrated Products, Nov. 26, 2011.

* cited by examiner

ANALOG FRONT-END CIRCUIT FOR MEASUREMENT

CROSS-REFERENCE TO RELATED APPLICATION

This application claims priority from Japanese Patent Application No. 2012-008061 filed with the Japan Patent Office on Jan. 18, 2012, the entire content of which is hereby incorporated by reference.

BACKGROUND

1. Technical Field

The present disclosure relates to an analog front-end circuit for measurement suitable for use as, for example, a front end for a recorder or a temperature controller.

2. Related Art

A sensor signal processor (MAX1464) manufactured by Maxim Integrated Products is known as an example of the analog front-end circuit (Non-Patent Document 1: "Low-Power, Low-Noise Multichannel Sensor Signal Processor", MAX1464 Data Sheet Rev 0, http://www.maximintegrated-.com/datasheet/index.mvp/id/4590). MAX1464 is a low power and low noise multichannel sensor signal processor. This MAX1464 is often used for industrial, automotive, and process control applications such as pressure sensing/compensation, RTD (Resistance Temperature Detector)/thermocouple linearization, weight sensing/classification, and remote process monitoring with limit indication.

MAX1464 includes a MUX (Multiplexer), a PGA (Programmable Gain Amplifier), an ADC (Analog-Digital Converter), a CPU (Central Processing Unit), a DAC (Digital-Analog Converter), and a PWM (Pulse Width Modulator). MAX1464 having such a configuration operates, for example, as follows: Output from a sensor connected to MAX1464 is selected by the MUX and subjected to gain adjustment by the PGA. Subsequently, the sensor output is converted to a digital value by the ADC. The digital data obtained by the conversion is then computed by the CPU. The resulting data is output as a digital signal from the CPU to a system via a serial interface. Alternatively, the digital signal is converted to an analog signal by the DAC or to a pulse width modulation (PWM) signal by the PWM and then output.

SUMMARY

An analog front-end circuit for measurement according to the present disclosure is an analog front-end circuit for measurement used as an interface between a sensor and a control device, the analog front-end circuit including: an isolated part including at least an AD conversion circuit configured to serve as an interface to the sensor; a non-isolated part including at least a control circuit configured to serve as an interface to the control device; and an isolated communication unit configured to perform isolated half-duplex communication between the isolated part and the non-isolated part. The control circuit is configured to transmit an AD conversion instruction to the AD conversion circuit after providing setting for measurement to the isolated part via the isolated communication unit, obtain a result of AD conversion by the AD conversion circuit from the isolated part via the isolated communication unit, and transfer the obtained AD conversion result to the control device.

DETAILED DESCRIPTION

Figure 1:
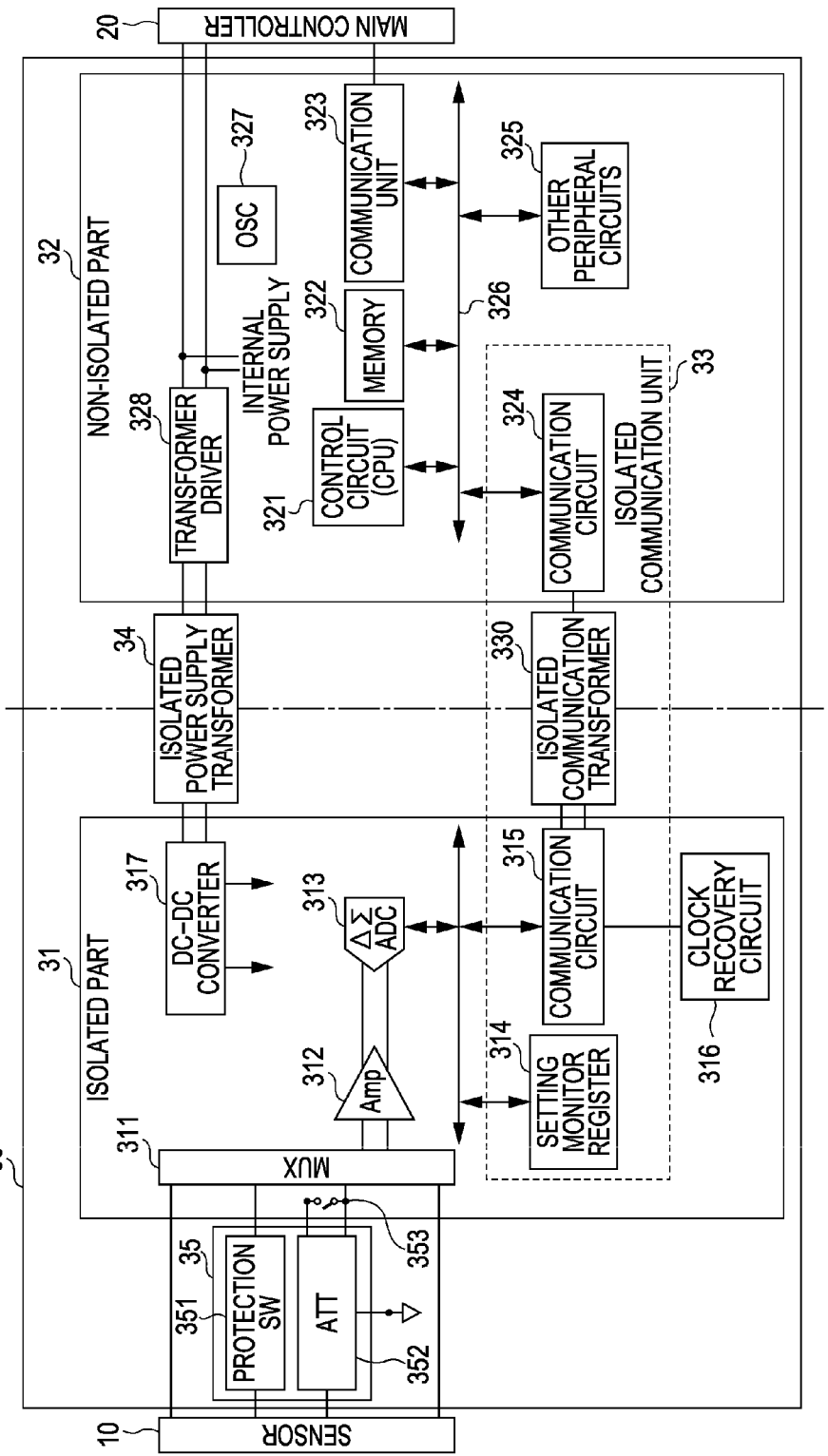
FIG. 1 is a block diagram illustrating a configuration of an analog front-end circuit for measurement according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The specification of a sensor signal processor, generally required as a front end for measurement such as an analog front end of a temperature controller, includes excessive input protection, AD conversion, isolation, and computation. MAX1464 described above, however, has an AD conversion function and a computation function but does not have an excessive input protection function and an isolation function. The excessive input protection function and the isolation function therefore need to be realized by an external circuit. In particular, the isolation function needs to include power supply isolation and communication isolation.

With respect to MAX1464, communication isolation needs to involve isolation of four signals: SCLK (clock), DI (data input), DO (data output), and CS (chip select). An isolation element such as a photocoupler is therefore added between MAX1464 and a circuit for signal transmission to/from MAX1464. The addition of photocouplers is disadvantageous in terms of cost and mounting area of a substrate. For example, when four photocouplers TLP283 manufactured by Toshiba Corporation are used, four 7-mm×2.6-mm mounting areas will be required. In the case of analog output from MAX1464, the DAC also requires a high precision isolation amplifier as an isolation element. This leads to increase in cost and mounting area.

Furthermore, all components (such as a CPU and a memory) of MAX1464 are driven by an isolated power supply. This increases power to be transmitted by the isolated power supply, and also increases loss. It is therefore difficult to realize front-end for measurement with small size, low power consumption, and low cost.

It is therefore an object of the present disclosure to provide an analog front-end circuit for measurement realizing small size, low power consumption, and low cost.

A first aspect of the present disclosure is an analog front-end circuit for measurement that is an interface between a sensor and an control device, the circuit including: an isolated part including at least an AD conversion circuit configured to serve as an interface to the sensor; a non-isolated part including at least a control circuit configured to serve as an interface to the control device; and an isolated communication unit configured to perform isolated half-duplex communication between the isolated part and the non-isolated part, wherein the control circuit is configured to provide setting for measurement to the isolated part via the isolated communication unit, then transmit an AD conversion instruction to the AD conversion circuit, obtain a result of AD conversion by the AD conversion circuit from the isolated part via the isolated communication unit, and transfer the obtained AD conversion result to the control device.

According to the first aspect based on the present disclosure, the control circuit included in the non-isolated part provides setting for measurement to the isolated part including the AD conversion circuit via the isolated communication unit that performs isolated half-duplex communication. Then, the control circuit transmits the AD conversion instruction to the AD conversion circuit. After AD conversion is performed by the AD conversion circuit, the control circuit obtains the result of AD conversion by the AD conversion circuit from the isolated part via the isolated communication unit. Furthermore, the control circuit transfers the obtained AD conversion result to the control device. In this manner, bidirectional data communication can be realized by one channel through isolated half-duplex communication by the isolated communication unit. Thus, it is not necessary to add an isolation element such as a photocoupler. As a result, it is advantageous in terms of cost and mounting area. In addition, as described above, the control circuit is arranged in the non-isolated part. This allows for isolated communication between the AD conversion circuit included in the isolated part and the control circuit included in the non-isolated part. It is therefore possible to reduce the amount of data to be transmitted through the isolated communication as compared to a configuration in which the control circuit is arranged in the isolated part.

According to a second aspect based on the present disclosure, in the analog front-end circuit for measurement according to the first aspect, the non-isolated part is configured to insert continuous NOP instructions at equal intervals between the AD conversion instruction and the next AD conversion instruction, and transmit these instructions to the isolated part via the isolated communication unit, and the isolated part is configured to recover a clock to be used therein by extracting clock components superimposed on the AD conversion instructions and the NOP instructions, and further transfer the AD conversion result and provide a status response to the non-isolated part via the isolated communication unit. According to the present disclosure, the clock components are superimposed on the AD conversion instructions and the NOP instructions transmitted from the non-isolated part and the clock is recovered at the isolated part, which allows for transmission of necessary signals and the clock between the isolated part and the non-isolated part only through one channel of half-duplex communication.

According to a third aspect based on the present disclosure, in the analog front-end circuit for measurement according to the first or second aspect, the isolated part includes: an input switching circuit configured to switch one or more input sensor outputs; a setting monitor register in which the setting for measurement provided by the non-isolated part is stored; an amplifier configured to amplify the sensor output selected in a range included in the setting and output the amplified sensor output to the AD conversion circuit; a communication circuit configured to perform the isolated half-duplex communication with the non-isolated part via an isolated communication transformer; and a DC-DC converter configured to convert power supplied from the control device via the non-isolated part and an isolated power supply transformer into required voltage. According to the present aspect, the AD conversion circuit included in the isolated part and the control circuit included in the non-isolated part can be isolated from each other by the isolated communication unit that performs isolated half-duplex communication. Moreover, according to the present aspect, only minimum circuits required for the AD conversion circuit are arranged in the isolated part. This allows the power consumption of circuits to which power is supplied through isolated power supply to be reduced and loss of the isolated power supply to be suppressed. As a result, lower power consumption of the analog front-end circuit for measurement can be achieved.

According to a fourth aspect based on the present disclosure, in the analog front-end circuit for measurement according to the third aspect, the isolated part further includes an excessive input protection circuit that is arranged between the sensor and the input switching circuit and configured to protect internal circuits from excessive input due to the output from the sensor. According to the present aspect, the excessive input protection circuit that protects internal components from excessive input is provided in the analog front-end circuit for measurement. Therefore, according to the present aspect, the excessive input protection function can be achieved in addition to the isolating function.

According to a fifth aspect based on the present disclosure, in the analog front-end circuit for measurement according to the third aspect, the isolated communication transformer is formed by a wiring pattern on a substrate on which the isolated part and the non-isolated part are mounted. According to the present aspect, the isolated communication transformer is implemented by the wiring pattern on the substrate. This eliminates the need for components such as a photocoupler that are needed for isolated communication in the related art, which leads to reduction in cost and mounting area.

According to a sixth aspect based on the present disclosure, in the analog front-end circuit for measurement according to the first aspect, the non-isolated part includes a peripheral circuit and a transformer driver, wherein the peripheral circuit is connected to an internal bus and includes the control circuit and a communication circuit configured to perform the isolated half-duplex communication via the isolated communication unit, and the transformer driver is configured to drive the isolated power supply transformer that supplies power supplied from the control device to the isolated part. According to the present disclosure, the AD conversion circuit included in the isolated part and the control circuit included in the non-isolated part can be isolated from each other by the isolated communication unit that performs isolated half-duplex communication. Furthermore, power consumption of circuits to which power is supplied through isolated power supply can be reduced and loss of the isolated power supply can be suppressed. According to the present aspect, power consumption can therefore be made lower.

According to a seventh aspect based on the present disclosure, in the analog front-end circuit for measurement according to any one of the third to sixth aspects, the isolated power supply transformer is a piezoelectric transformer. According to the present aspect, isolated power supply can be realized by using the piezoelectric transformer as the isolated power supply transformer. It is thus possible to provide an analog front-end circuit for measurement with smaller size and having higher efficiency and lower electromagnetic noise.

According to an eighth aspect based on the present disclosure, in the analog front-end circuit for measurement according to any one of the first to seventh aspects, the isolated part, the non-isolated part, and the isolated communication unit are mounted on the same substrate. According to the present aspect, functions necessary for measurement can be achieved in one package. It is thus possible to reduce the number of man-hours in product development. This can therefore contribute to reduction in size and in cost.

According to a ninth aspect based on the present disclosure, in the analog front-end circuit for measurement according to any one of the third to seventh aspects, the isolated part, the non-isolated part, the isolated communication unit, and the isolated power supply transformer are mounted on the same substrate. According to the present disclosure, functions necessary for measurement can be achieved in one package. It is thus possible to reduce the number of man-hours in product development. This can therefore contribute to reduction in size and in cost.

An embodiment of the present disclosure will be described in detail below with reference to the accompanying drawings.

Configuration of Embodiment

FIG. 1 is a block diagram illustrating a configuration of an analog front-end circuit 30 for measurement according to an embodiment of the present disclosure. According to FIG. 1, the analog front-end circuit 30 for measurement according to the present embodiment serves as an interface between a sensor 10 and a main controller 20 (control device) of a system. The front-end circuit 30 includes an isolated part 31, a non-isolated part 32, and an isolated communication unit 33. The isolated part 31 serves as an interface to the sensor 10. On the other hand, the non-isolated part 32 serves as an interface to the main controller 20. The isolated communication unit 33 connects the isolated part 31 and the non-isolated part 32 and performs isolated half-duplex communication. These isolated part 31, non-isolated part 32, and isolated communication unit 33 are mounted on the same substrate (not illustrated) together with an isolated power supply transformer, which will be described later.

The non-isolated part 32 sends an AD conversion instruction to the isolated part 31 via the isolated communication unit 33. In this process, continuous NOP (No Operation) instructions at equal intervals are transmitted between an AD conversion instruction and the next AD conversion instruction. The isolated part 31 that has received these instructions recovers a clock to be used therein by extracting clock components superimposed on the AD conversion instructions and the NOP instructions. Subsequently, the isolated part 31 transfers a result of conversion obtained by AD conversion by an AD conversion circuit 313 (to be described later) and provides a status response to the non-isolated part 32 via the isolated communication unit 33.

The isolated part 31 includes an input switching circuit (MUX) 311, an amplifier 312, the AD conversion circuit 313, a setting monitor register 314, a communication circuit 315, a clock recovery circuit 316, and a DC-DC converter 317.

The input switching circuit 311 receives a sensor output signal from the sensor 10 via an excessive input protection circuit 35. The input switching circuit 311 switches one or more input sensor outputs and then outputs switched (selected) sensor output to the amplifier 312. Subsequently, the amplifier 312 amplifies the sensor output within a preset range in the setting monitor register 314. The amplified sensor output is output from the amplifier 312 to the AD conversion circuit 313. The AD conversion circuit 313 converts an analog signal of the sensor output to a digital signal. Here, the AD conversion circuit 313 used in the present embodiment is a ΔΣ AD conversion circuit that performs analog-to-digital conversion by a ΔΣ modulation method. Here, in the present disclosure, the AD conversion circuit 313 is not limited to the ΔΣ AD conversion circuit. Alternatively, any of other types of AD conversion circuits, such as a parallel comparison type, a sequential comparison type, and a successive comparison type. Furthermore, the setting monitor register 314 stores setting for measurement, including the aforementioned range, set by the non-isolated part 32 (control circuit described later).

The communication circuit 315 is a communication interface for performing isolated half-duplex communication with the non-isolated part 32 via an isolated communication transformer 330. The clock recovery circuit 316 extracts the clock components superimposed on the AD conversion instructions and the NOP instructions sent from the non-isolated part 32 and received by the communication circuit 315 to recover a clock to be used therein. The DC-DC converter 317 converts power supplied from the main controller 20 via the non-isolated part 32 and an isolated power supply transformer 34 into required voltage to drive internal components.

The isolated part 31 may be connected to the sensor 10 via the excessive input protection circuit 35. The excessive input protection circuit 35 includes a protection switch (SW) 351 that protects internal circuits from excessive input due to output from the sensor 10, an attenuator (ATT) 352 that attenuates high voltage, when such high voltage is input, down to predetermined voltage, and a switch 353 that turns the attenuator (ATT) 352 on/off.

The non-isolated part 32 provides setting for measurement to the isolated part 31 via the isolated communication unit 33. The non-isolated part 32 then sends an AD conversion instruction to the AD conversion circuit 313. The non-isolated part 32 further obtains a result of conversion by the AD conversion circuit 313 from the isolated part 31 via the isolated communication unit 33. Subsequently, the non-isolated part 32 transfers the obtained conversion result to the main controller 20. Therefore, the non-isolated part 32 includes other components (a control circuit (CPU 321), a memory 322, a communication unit 323, a communication circuit 324, and other peripheral circuits 325) that are connected to one another via an internal bus 326. The internal bus 326 is constituted by a plurality of lines for address, data, and control, and connects these components in common.

The control circuit 321 accesses programs stored in the memory 322 to generate the aforementioned instructions and supply the instructions to the AD conversion circuit 313 in the isolated part 31. The control circuit 321 superimposes a clock generated by an oscillator 327 on the aforementioned instructions. Subsequently, the control circuit 321 sends the instructions on which the clock is superimposed to the isolated part 31 (communication circuit 315) via the communication circuit 324 and the isolated communication transformer 330. The communication circuit 315 in the isolated part 31 and the communication circuit 324 in the non-isolated part 32 are communication interfaces for performing isolated half-duplex communication between the isolated part 31 and the non-isolated part 32 via the isolated communication transformer 330.

The non-isolated part 32 further includes the oscillator (OSC) 327 and a transformer driver 328. The oscillator 327 generates a reference clock. On the other hand, the transformer driver 328 is used for driving the isolated power supply transformer 34, which will be described later, that supplies power supplied from the main controller 20 to isolated part 31.

Figure 2:
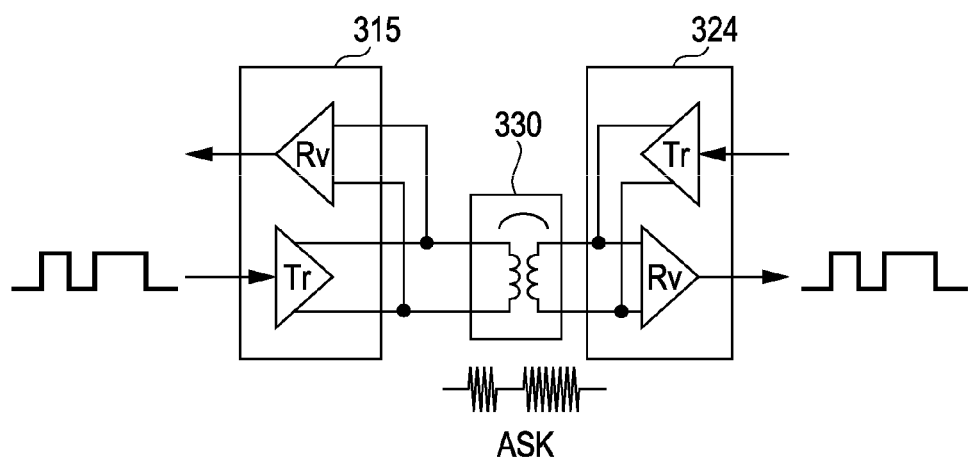
FIG. 2 is a diagram illustrating a configuration of an isolated communication unit of the analog front-end circuit for measurement according to the embodiment of the present disclosure.

As illustrated in FIG. 2, the isolated communication unit 33 is constituted by the communication circuit 315 in the isolated part 31, the isolated communication transformer 330, and the communication circuit 324 in the non-isolated part 32. In other words, the isolated communication unit 33 is configured to perform isolated half-duplex communication between the isolated part 31 and the non-isolated part 32.

Figure 3:
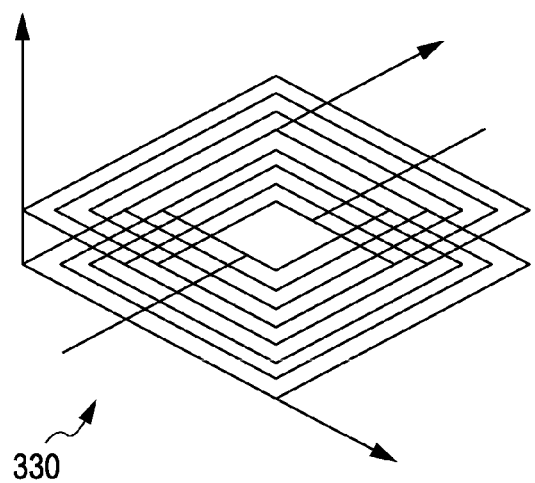
FIG. 3 is a diagram illustrating implementation structure of an isolated communication transformer for the analog front-end circuit for measurement according to the embodiment of the present disclosure.

The communication circuits 315 and 324 each include a transmitter Tr and a receiver Rv, and employ binary ASK (Amplitude Shift Keying) modulation to perform half-duplex communication. Thus, transmission of setting write instructions and measurement start instructions (AD conversion instructions) from the non-isolated part 32 to the isolated part 31, and transmission of AD conversion results, transmission of status, and data transmission for reading setting from the isolated part 31 to the non-isolated part 32 are realized by one communication channel. The isolated communication transformer 330 is formed by using wiring on the substrate. As illustrated in FIG. 3, for example, the isolated communication transformer 330 is implemented by folding back a wiring pattern printed on the substrate (analog front-end circuit 30 for measurement) on which the isolated part 31 and the non-isolated part 32 are mounted in a manner that the folded back part of the wiring pattern overlaps with the other part thereof.

Operation of Embodiment

Operation of the analog front-end circuit 30 for measurement according to the present embodiment will be described in detail below.

Sensor output signals generated by the sensor 10 as a result of measurement by the sensor 10 are input to the input switching circuit 311 (isolated part 31) of the analog front-end circuit 30 for measurement. The input switching circuit 311 sequentially switches the input sensor output signals. The sensor output signal selected here is input to the amplifier 312. The sensor output signal is input to the isolated part 31 of the analog front-end circuit 30 for measurement as necessary via the excessive input protection circuit 35. The amplifier 312 adjusts the gain of the input sensor output signal to be within the range set in the setting monitor register 314. The gain-adjusted signal is output from the amplifier 312 to the AD conversion circuit 313. The input signal is subjected to AD conversion by the AD conversion circuit 313. The result of the AD conversion (AD converted data) is transmitted from the isolated part 31 to the non-isolated part 32 via the isolated communication unit 33 (communication circuit 315, isolated communication transformer 330, and communication circuit 324). The data input to the non-isolated part 32 is stored in the memory 322 under control of the control circuit 321 in the non-isolated part 32.

The control circuit 321 performs computation such as linearization for temperature measurement and calibration on the result of AD conversion (AD converted data). The computation result is transferred as a physical quantity from the control circuit 321 to the main controller 20 via the communication unit 323. In addition, setting for measurement such as a sensor type, a range, and a measurement period is input as an instruction to the instruction control circuit 321 from the main controller 20 via the communication unit 323. The control circuit 321 determines setting for the isolated part 31 based on the set value for measurement. Thus, the control circuit 321 transmits the aforementioned setting (instruction) to the isolated part 31 via the isolated communication unit 33. The instruction transmitted to the isolated part 31 is stored in the setting monitor register 314. Examples of the setting necessary for the isolated part 31 include on/off of the attenuator 352, on/off of the switch 353, selection of a sensor by the input switching circuit 311, gain setting for the amplifier 312 and measurement time of the AD conversion circuit 313.

A trigger for starting measurement is input as a trigger instruction from the main controller 20 to the control circuit 321 via the communication unit 323. When the trigger instruction is input, the control circuit 321 transmits the AD conversion instruction to the isolated part 31 via the isolated communication unit 33. The isolated part 31 (AD conversion circuit 313) receives the AD conversion instruction and performs AD conversion. When the AD conversion is terminated, the isolated part 31 transmits the conversion result to the non-isolated part 32 via the isolated communication unit 33. The non-isolated part 32 can also read error status such as circuit abnormality and the set value of the isolated part 31 via the isolated communication unit 33.

The main controller 20 of the system is responsible for power supply to the analog front-end circuit 30 for measurement (non-isolated part 32) according to the present embodiment. Power supply to the isolated part 31 is performed by the isolated power supply transformer 34. Thus, the non-isolated part 32 drives the isolated power supply transformer 34 via the transformer driver 328. Here, the DC-DC converter 317 connected to the isolated power supply transformer 34 converts the output voltage of the isolated power supply transformer 34 into voltage required for the isolated part 31.

Figure 4:
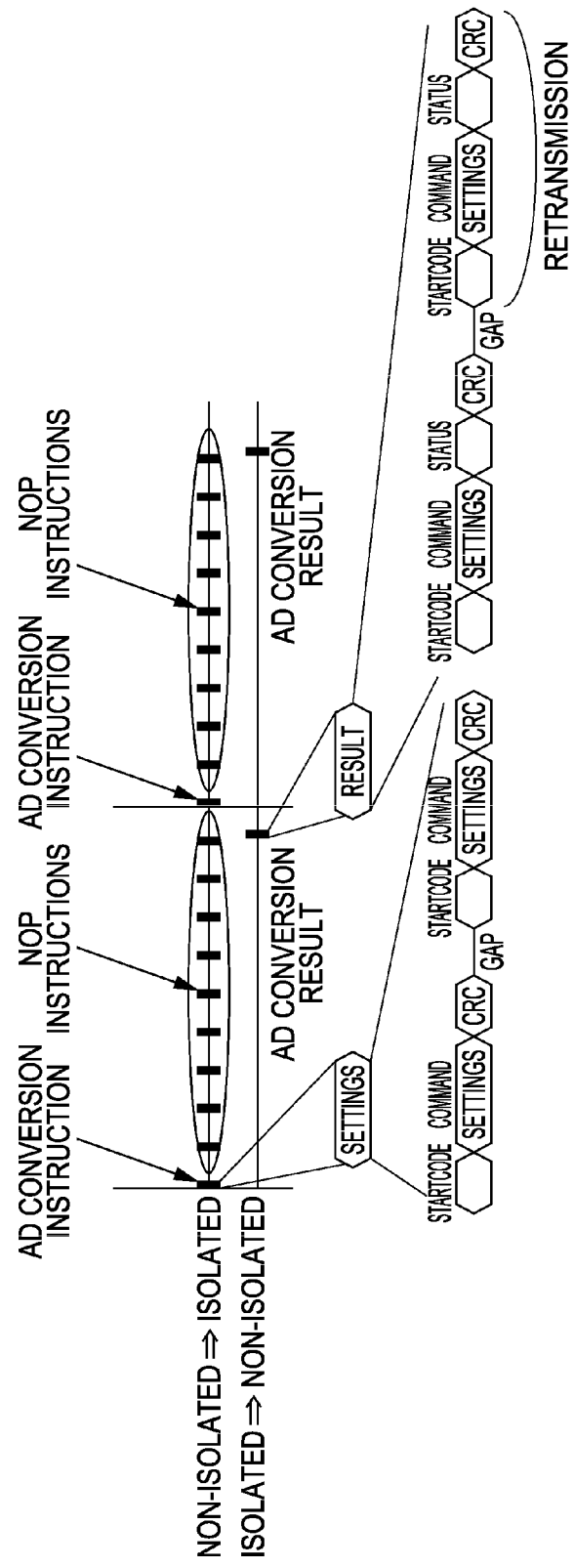
FIG. 4 is a diagram referenced for describing an isolated communication protocol used by the analog front-end circuit for measurement according to the embodiment of the present disclosure.

FIG. 4 illustrates an example of an isolated communication protocol used in the analog front-end circuit 30 for measurement according to the present embodiment. As illustrated in FIG. 4, the non-isolated part 32 transmits necessary setting information together with the AD conversion instruction to the isolated part 31. On the other hand, the isolated part 31 transmits an AD conversion result and status to the non-isolated part 32. While two separate transmission waveforms are illustrated in FIG. 4 for convenience sake, the waveforms are actually transmitted on the same line in a bidirectional manner.

More specifically, the control circuit 321 in the non-isolated part 32 inserts NOP instructions at regular intervals between a generated AD conversion instruction and the next AD conversion instruction. Subsequently, the control circuit 321 continuously transmits these instructions to the isolated part 31 via the isolated communication unit 33. In the isolated part 31, the clock recovery circuit 316 extracts the superimposed clock components in response to the received AD conversion instruction. As a result, a clock to be used in the isolated part 31 is generated. The original clock is generated by the oscillator 327 in the non-isolated part 32.

The control circuit 321 transmits twice the same contents of the AD conversion instructions and the NOP instructions to the isolated part 31. Similarly, the isolated part 31 transmits twice the same contents of the AD conversion results to the non-isolated part 32. In this process, the presence of an error is detected by CRC (Cyclic Redundancy Check). As a result, it is possible to avoid communication errors due to noise.

Effects of Embodiment

As described above, in the analog front-end circuit 30 for measurement according to the present embodiment, the isolated part 31 (AD conversion circuit 313) and the non-isolated part 32 (control circuit 321) are isolated from each other. As a result, it is possible to reduce the amount of data transmitted through isolated communication. In this case, bidirectional data transmission in half-duplex communication through the isolated communication is realized by one channel. In addition, transmission of a clock is made by superimposing the clock components on data communication. Furthermore, the isolated part 31 (clock recovery circuit 316) can recover the clock. It is therefore possible to transmit necessary signals between the isolated part 31 and the non-isolated part 32 through isolated half-duplex communication. Examples of the necessary signals include clocks and reset data in addition to data such as setting, AD conversion results obtained by measurement and status.

The isolated communication transformer 330 is implemented by a wiring pattern on the substrate mounted on the analog front-end circuit 30 for measurement according to the present embodiment. Therefore, the analog front-end circuit 30 for measurement does not need components such as a photocoupler that are needed for isolated communication in the related art. According to the present embodiment, it is thus possible to reduce cost of the analog front-end circuit 30 for measurement and reduce substrate mounting area. Furthermore, as a result of isolation of the AD conversion circuit 313 and the control circuit 321 from each other, power consumption of circuits to which power is supplied through the isolated power supply is reduced. It is thus possible to reduce loss of the isolated power supply and achieve lower power consumption. Note that the use of a piezoelectric transformer for the isolated power supply transformer 34 to realize the isolated power supply allows the analog front-end circuit 30 for measurement to be smaller in size and have higher efficiency and lower electromagnetic noise.

Moreover, in the analog front-end circuit 30 for measurement according to the present embodiment, functions such as measurement, isolation, and computation necessary for measurement are packaged. As a result, it is possible to greatly reduce the number of man-hours in product development. Furthermore, as a result of implementing the control circuit 321 by the CPU, it is possible to change the operation of the analog front-end circuit 30 for measurement by means of programs. The analog front-end circuit 30 for measurement according to the present embodiment can therefore be applied to a wide range of products and it is possible to achieve reduction in the number of man-hours in product development and in cost by the number effect. Furthermore, the analog front-end circuit 30 for measurement according to the present embodiment can be further reduced in size and power consumption as compared to the circuit in the related art. A plurality of analog front-end circuits 30 for measurement according to the present embodiment can therefore be arranged in parallel in a multipoint measuring device, which allows for improvement in performance such as higher measuring speed as compared to the scanner type in the related art.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An analog front-end circuit for measurement used as an interface between a sensor and a control device, the circuit comprising:
    an isolated part including at least an Analog-Digital (AD) conversion circuit configured to serve as an interface to the sensor;
    a non-isolated part including at least a control circuit configured to serve as an interface to the control device; and
    an isolated communication unit configured to perform isolated half-duplex communication between the isolated part and the non-isolated part, wherein
    the control circuit is configured to
    transmit an AD conversion instruction to the AD conversion circuit after providing setting for measurement to the isolated part via the isolated communication unit,
    obtain a result of AD conversion by the AD conversion circuit from the isolated part via the isolated communication unit, and
    transfer the obtained AD conversion result to the control device,
    wherein the isolated part includes:
    an input switching circuit configured to switch one or more input sensor outputs;
    a setting monitor register in which the setting for measurement provided by the non-isolated part is stored;
    an amplifier configured to amplify the output from the sensor selected in a range included in the setting and output the amplified sensor output to the AD conversion circuit;
    a communication circuit configured to perform the isolated half-duplex communication with the non-isolated part via an isolated communication transformer; and
    a Direct Current to Direct Current (DC-DC) converter configured to convert power supplied from the control device via the non-isolated part and an isolated power supply transformer into a required voltage.

2. The analog front-end circuit for measurement according to claim 1, wherein the isolated part further includes an excessive input protection circuit that is arranged between the sensor and the input switching circuit and configured to protect internal circuits from excessive input due to the output from the sensor.

3. The analog front-end circuit for measurement according to claim 1, wherein the isolated communication transformer is formed by a wiring pattern on a substrate on which the isolated part and the non-isolated part are mounted.

4. The analog front-end circuit for measurement according to claim 1, wherein the isolated power supply transformer is a piezoelectric transformer.

5. The analog front-end circuit for measurement according to claim 1, wherein the isolated part, the non-isolated part, the isolated communication unit, and the isolated power supply transformer are mounted on the same substrate.

6. The analog front-end circuit for measurement according to claim 1, wherein the non-isolated part includes:
    a peripheral circuit connected to an internal bus and including a communication circuit configured to perform isolated half-duplex communication via the control circuit and the isolated communication unit; and
    a transformer driver configured to drive the isolated power supply transformer configured to supply power supplied from the control device to the isolated part.

7. The analog front-end circuit for measurement according to claim 6, wherein the isolated power supply transformer is a piezoelectric transformer.

8. The analog front-end circuit for measurement according to claim 6, wherein the isolated part, the non-isolated part, the isolated communication unit, and the isolated power supply transformer are mounted on the same substrate.

9. The analog front-end circuit for measurement according to claim 1, wherein the isolated part, the non-isolated part, and the isolated communication unit are mounted on the same substrate.

10. The analog front-end circuit for measurement according to claim 1, wherein
    the non-isolated part is configured to insert continuous No Operation (NOP) instructions at equal intervals between the AD conversion instruction and a next AD conversion instruction when transmitting the AD conversion instruction to the isolated part via the isolated communication unit.

11. The analog front-end circuit for measurement according to claim 1, wherein
the control circuit of the non-isolated part is configured to receive a measurement setting for the sensor from the control device.

12. An analog front-end circuit for measurement used as an interface between a sensor and a control device, the circuit comprising:
an isolated part including at least an Analog-Digital (AD) conversion circuit configured to serve as an interface to the sensor;
a non-isolated part including at least a control circuit configured to serve as an interface to the control device; and
an isolated communication unit configured to perform isolated half-duplex communication between the isolated part and the non-isolated part, wherein
the control circuit is configured to
transmit an AD conversion instruction to the AD conversion circuit after providing setting for measurement to the isolated part via the isolated communication unit,
obtain a result of AD conversion by the AD conversion circuit from the isolated part via the isolated communication unit, and
transfer the obtained AD conversion result to the control device, wherein
the non-isolated part is configured to insert continuous No Operation (NOP) instructions at equal intervals between the AD conversion instruction and a next AD conversion instruction, and transmit these instructions to the isolated part via the isolated communication unit, and
the isolated part is configured to recover a clock to be used therein by extracting clock components superimposed on the AD conversion instructions and the NOP instructions, and further transfer the AD conversion result and provide a status response to the non-isolated part via the isolated communication unit.

* * * * *